(12) United States Patent
Costa et al.

(10) Patent No.: US 11,192,209 B2
(45) Date of Patent: Dec. 7, 2021

(54) LASER PRETREATMENT OF METAL SUBSTRATES FOR ELECTRICAL CIRCUIT BOARDS

(71) Applicant: AB Mikroelektronik Gesellschaft mit beschraenkter Haftung, Salzburg (AT)

(72) Inventors: Louis Costa, Grödig (AT); Horia Barb, Salzburg (AT)

(73) Assignee: AB Mikroelektronik GmbH, Salzburg (AT)

( * ) Notice: Subject to any disclaimer, the term of this patent is extended or adjusted under 35 U.S.C. 154(b) by 103 days.

(21) Appl. No.: 16/734,588

(22) Filed: Jan. 6, 2020

(65) Prior Publication Data

US 2020/0223014 A1 Jul. 16, 2020

Related U.S. Application Data

(60) Provisional application No. 62/792,153, filed on Jan. 14, 2019.

(51) Int. Cl.
| | | |
|---|---|---|
| *H01L 21/00* | (2006.01) | |
| *B23K 26/352* | (2014.01) | |
| *B23K 26/0622* | (2014.01) | |
| *B23K 1/20* | (2006.01) | |
| *B23K 26/40* | (2014.01) | |

(Continued)

(52) U.S. Cl.
CPC ............ *B23K 26/3584* (2018.08); *B23K 1/20* (2013.01); *B23K 26/0622* (2015.10); *B23K 26/40* (2013.01); *H01L 21/4875* (2013.01); *H01L 24/83* (2013.01); *B23K 2101/40* (2018.08); *B23K 2103/10* (2018.08); *B23K 2103/56* (2018.08); *H01L 2224/83851* (2013.01)

(58) Field of Classification Search
CPC ....... H01L 21/4875; H01L 24/83; H01B 1/00; H01B 1/023; B23K 26/3584; B23K 26/0622; B23K 1/20; G11B 5/8404; G11B 5/73917; C03C 3/091
USPC ............................ 438/119; 427/126.4, 142
See application file for complete search history.

(56) References Cited

U.S. PATENT DOCUMENTS

| | | | | |
|---|---|---|---|---|
| 5,108,781 A | * | 4/1992 | Ranjan | ..................... G11B 5/00 427/128 |
| 8,497,448 B2 | | 7/2013 | Barkhausen et al. | |

(Continued)

FOREIGN PATENT DOCUMENTS

| | | |
|---|---|---|
| AT | 512 041 | 5/2013 |
| DE | 19900910 | 7/2000 |
| DE | 102007020748 | 11/2008 |

*Primary Examiner* — Brook Kebede
(74) *Attorney, Agent, or Firm* — Dority & Manning, P.A.

(57) ABSTRACT

Methods for processing a metal substrate for use in a power electronics device are provided. In one example, the method includes placing a metal substrate on a support associated with a laser system. The method includes performing a pulsed laser treatment process on at least a portion of the surface of the metal substrate. The pulsed laser treatment process exposes the at least a portion of the surface of the metal substrate to a plurality of laser pulses to modify a surface roughness of the at least a portion of the surface of the metal substrate. After performing the pulsed laser treatment process, the method includes creating a metallized interface for coupling an electrical component to the metal substrate at the at least a portion of the surface of the metal substrate.

20 Claims, 7 Drawing Sheets

(51) Int. Cl.
*H01L 21/48* (2006.01)
*H01L 23/00* (2006.01)
*B23K 103/10* (2006.01)
*B23K 103/00* (2006.01)
*B23K 101/40* (2006.01)

(56) References Cited

U.S. PATENT DOCUMENTS

| | | | |
|---|---|---|---|
| 2002/0037437 A1* | 3/2002 | Yamamoto | G11B 5/8404 428/848.2 |
| 2012/0296350 A1* | 11/2012 | Kar | A61L 27/50 606/151 |
| 2015/0044360 A1 | 2/2015 | Burns et al. | |

* cited by examiner

LASER PRETREATMENT OF METAL SUBSTRATES FOR ELECTRICAL CIRCUIT BOARDS

PRIORITY CLAIM

The present application claims the benefit of priority of U.S. Provisional Patent Application Ser. No. 62/792,153, titled "Laser Pretreatment of Metal Substrates for Electrical Circuit Boards," filed on Jan. 14, 2019, which is incorporated herein by reference for all purposes.

FIELD

The present disclosure relates generally to pretreatment of metal surfaces used in power electronics applications.

BACKGROUND

Metal surfaces, such as aluminum and/or aluminum alloy surfaces, can be used in a variety of applications for power electronic modules (e.g., LEDs, IGBTs, MOSFETs). For instance, due to its comparatively low weight and low costs, aluminum is frequently used as a cooling body for power electronic modules or also directly as a current-carrying conductor, in particular as a current or bus bar. Chemical properties of some metals can make it difficult to adhere components to the metal surface and/or metallize the metal surface. For example, a chemical property of aluminum is a thin oxide layer which forms very quickly in contact with air and which is formed by contact with oxygen in the atmosphere as a consequence of an oxidation process at the surface of an aluminum body. The oxide layer affords on the one hand corrosion protection but on the other hand it causes difficulty in connecting aluminum to other materials by soldering, welding or other known connecting procedures.

SUMMARY

Aspects and advantages of embodiments of the present disclosure will be set forth in part in the following description, or may be learned from the description, or may be learned through practice of the embodiments.

One example aspect of the present disclosure is directed to a method of treating a metal substrate for use in a power electronics device. The method includes placing a metal substrate on a support associated with a laser system. The method includes performing a pulsed laser treatment process on at least a portion of the surface of the metal substrate. The pulsed laser treatment process exposes the at least a portion of the surface of the metal substrate to a plurality of laser pulses to modify a surface roughness of the at least a portion of the surface of the metal substrate. After performing the pulsed laser treatment process, the method includes creating a metallized interface for coupling an electrical component to the metal substrate at the at least a portion of the surface of the metal substrate. In some embodiments, the laser pretreatment process can at least partially remove at least a portion of an oxide layer on the metal substrate.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
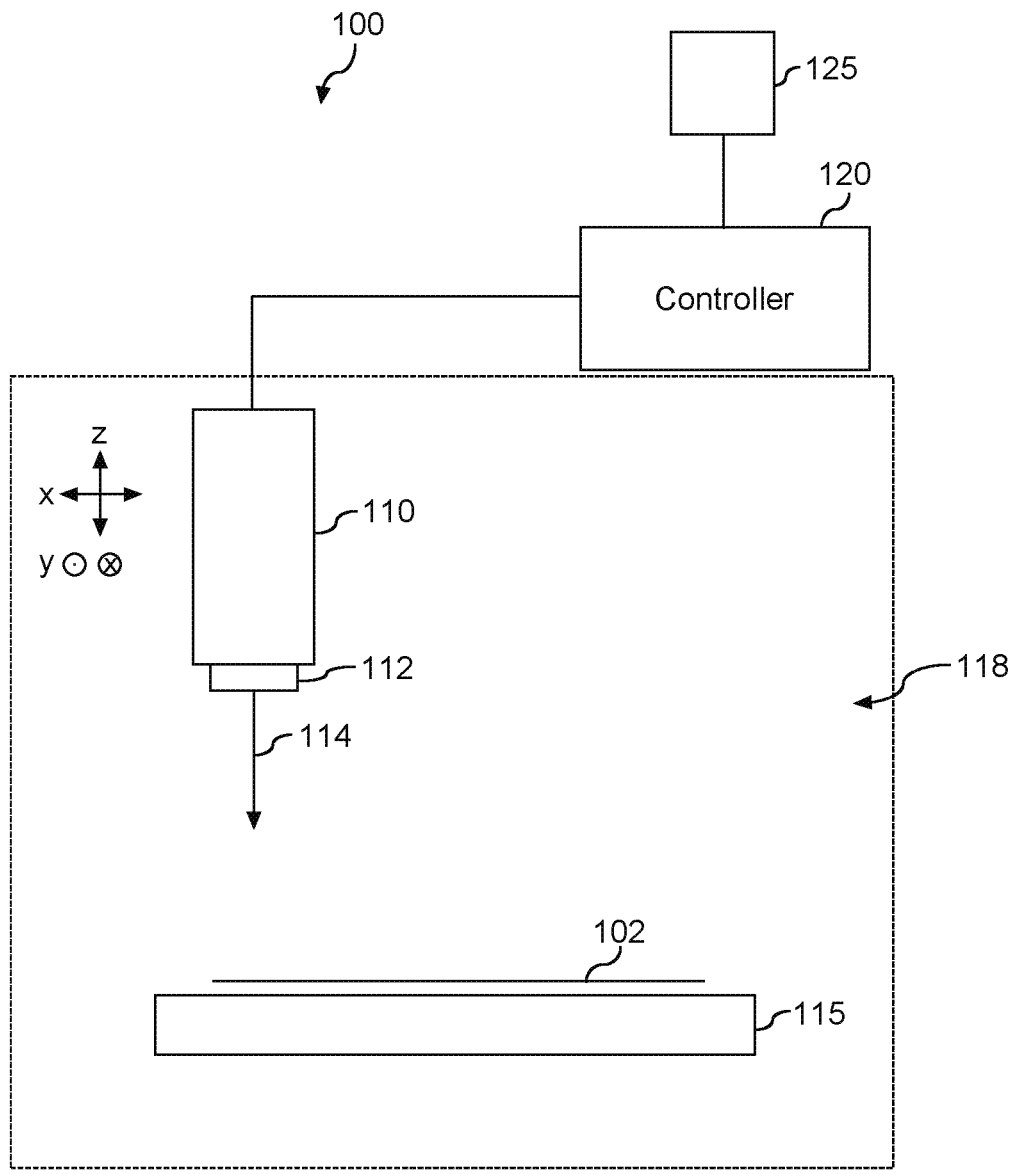
FIG. 1 depicts an example laser treatment system that can be used to implement methods according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to laser pretreatment of metal surfaces for use in power electronic applications, such as in power electronic devices used in automotive applications. The metal substrate can be treated using a pulsed laser pretreatment process. The pulsed laser pretreatment process can expose at least a portion of the surface of the metal substrate to a plurality of laser pulses. The plurality of laser pulses can modify a surface roughness of the surface of the metal substrate. The plurality of laser pulses can at least partially remove at least a portion of an oxide layer on the metal substrate. After the pulsed laser pretreatment process, a metallized interface can be created for coupling an electrical component to the metal substrate.

Example aspects of the present disclosure can provide a number of technical effects and benefits. For instance, adhering properties for coupling the electrical component to the metal substrate can be improved as a result of the surface roughness and/or the oxide layer removal. Electrical performance of the connection between the electrical device and the metal substrate can also be improved as a result of microstructure (e.g., leading to improved bonding quality)

and/or oxide remove. For instance, parasitic resistance associated with electrical connections between the electrical device and the metal substrate can be reduced.

The metal substrate can at least partially include an aluminum and/or aluminum alloy. For example, the aluminum material can be of the quality EN AW-1050A or EN AW-1060A in accordance with European Standard EN 573, which contains at least 99.5% by weight or 99.6% by weight of aluminum. As another example, the metal substrate can include an aluminum allow having manganese or magnesium. For instance, the metal substrate can include EN AW-3003 (AlMn1Cu), EN AW-5005 (AlMg1), EN AW-3103 (AlMn1), or EN AW-5754 (AlMg3). Those of ordinary skill in the art, using the disclosures provided herein, will understand that other suitable metal substrates can be used without deviating from the scope of the present disclosure.

In some embodiments, the pretreated metal substrate can be metallized and isolated by screen printed conductor pastes to create a surface for coupling electrical components to the metal substrate. In some embodiments, the pretreated metal substrate can be used for wire bonding or ribbon bonding an electrical component to the metal substrate. In some embodiments, the metal substrate can be used as a heat sink for passive electrical component(s) (e.g., LED(s)) or active electrical components (e.g., semiconductor chip(s)) that are bonded with a conductive adhesive glue (e.g., silver adhesive glue).

More particularly, in some example embodiments, a pulsed laser pretreatment process can be used in conjunction with screen printed conductor pastes to create a metallized interface. Aluminum exhibits a relative fast oxidation in normal atmosphere (e.g., 30-50% humidity). As a result, an oxidation layer can be generated on the metal substrate upon exposure to air. The oxidation layer can make it difficult to couple electrical components to the metal substrate using simple direct soft-solder processes.

To make the metal substrate solderable, a metallization of aluminum with solderable layers can be required. This can be accomplished, for instance, by screen printing conductor pastes. The screen-printed conductor pastes can be processed under a nitrogen atmosphere (e.g., less than 15 ppm oxygen) to suppress reactive corrosion. In some embodiments, the conductor paste can include a metal powder, organic binder, and glass frits. The metal power can include, for instance, copper or silver.

At elevated temperatures within a eutectic two-component system (e.g., aluminum and copper), there exists a point where diffusive processes between metal components can be induced. For instance, copper particles in the conductor paste can diffuse into the aluminum and vice versa. Close to the eutectic point, the glass frits can enrich the interface between the two metals and can act as a binder. As one example, copper-aluminum diffusive processes can be induced at temperatures of about 580° C. or greater and holding times of about ten minutes. As another example, silver-aluminum diffusive processes can be induced at temperatures of about 540° C. or greater and holding times of about ten minutes. The organic component of the conductor paste can be removed at lower temperatures, such as at about 250° C.

According to example aspects of the present disclosure, a laser pretreatment process can be conducted prior to screen printing the conductor paste. The laser pretreatment process can expose at least a portion of the metal surface to a plurality of laser pulses. For instance, in some embodiments, the laser pretreatment process can expose the metal surface to between about 25 and about 40 pulses. The number of laser pulses can allow for the drilling of partial holes into at least a portion of the metal surface to increase an overall contact area between a bonding surface and binding particles. Example laser pulse energies can be about 1 mJ, which can lead to power densities of up to about 4.5 MW/cm$^2$.

Density of the laser spots on the metal substrate can be controlled through an overlap parameter. The overlap parameter refers to the amount of overlap (scaled by spot diameter) of adjacent laser spots on the surface. For instance, a 0% overlap parameter means that the circles of two neighboring laser spots are touching. A positive value (e.g., +10%) means that the circles of two neighboring laser spots overlap. A negative value (e.g., −10%) means that the circles of two neighboring laser spots are separated.

According to example aspects of the present disclosure, surface roughness of the metal substrate can be modified based at least in part on the overlap parameter. For instance, the overlap parameter can be in the range of about 100% to about 15%. Metal material can be evaporated at positions where laser spots interact with the metal substrate. Positions where the laser spots interact with the metal substrate with low intensity (e.g., at the edge of the laser spot) material can be deposited and condensed, leading to high roughness values. For instance, valley structures with minimum to maximum values of up to about 200 μm can be achieved.

Using a combination of laser pretreatment with screen printed conductor pastes can create metallized interfaces with negligible DC parasitic resistance (e.g., less than about 0.1 mOhm). Reducing these parasitic resistances is desirable to reduce heat generation associated with high current in power electronics applications.

In addition, use of a laser pretreatment process in conjunction with screen printed conductor pastes according to example embodiments of the present disclosure can lead to increased binding energies between bonding particles and metal substrate as during a sintering process a larger diffusive area for the binary metal system is provided. Pretreatment of the metal substrate can improve adhesion force of insulating sinter materials. Higher adhesion forces can lead to improved lifetime performance of electrical circuit carriers (e.g., temperature change testing, thermomechanical stress testing, etc.).

In some embodiments, a laser pretreatment process is used in conjunction with wire bonding and/or ribbon bonding on a metal substrate. For instance, the metal substrate (e.g., aluminum substrate) can be cleaned from organic residues. The metal substrate can be microstructured with a plurality of laser pulses during a laser pretreatment process. Subsequently, wire bonding and/or ribbon bonding is performed on the treated metal substrate. This can result in elevated bonding forces between wire/ribbon and the metal substrate.

In these example embodiments, the laser pretreatment process can expose the metal surface to between about 1 and about 20 pulses, such as between about 5 and about 20 laser pulses, such as between about 5 and about 10 laser pulses. Example laser pulse energies can be about 1 mJ, which can lead to power densities of up to about 4.5 MW/cm$^2$. In these example embodiments, adhesion force can be increased, for instance, by a factor of about 2.

In some embodiments, a laser pretreatment process is used in conjunction in conjunction with die attach of electrical components to the metal substrate using, for instance, a conductive adhesive glue (e.g., silver adhesive glue). In these example embodiments, the laser pretreatment process can expose the metal surface to between about 1 and about 20 pulses, such as between about 5 and about 20 laser pulses, such as between about 5 and about 10 laser pulses. Example laser pulse energies can be about 1 mJ, which can lead to power densities of up to about 4.5 MW/cm$^2$. In these example embodiments, adhesion force can be increased, for instance, by a factor of about 2 to about 5.

One example embodiment of the present disclosure is directed to a method of treating a metal substrate for use in a power electronics device. The method includes placing a metal substrate on a support associated with a laser system; performing a pulsed laser treatment process on at least a portion of the surface of the metal substrate, the laser treatment process exposing the at least a portion of the surface of the metal substrate to a plurality of laser pulses to modify a surface roughness of the at least a portion of the surface of the metal substrate; and after performing the pulsed laser treatment process, creating a metallized interface for coupling an electrical component to the metal substrate at the at least a portion of the surface of the metal substrate. In some embodiments, the plurality of laser pulses removes at least a portion of an oxide layer on the metal substrate to prepare the metal substrate for coupling an electrical component to the metal substrate. In some embodiments, the metal substrate comprises aluminum or aluminum alloy. In some embodiments, the metallized interface has a resistance of less than about 0.1 mOhms.

In some embodiments, creating a metallized interface comprises applying a screen-printed conductor paste to the at least a portion of the metal substrate. For instance, the method can include applying a conductor paste using a screen-printing process to the at least a portion of the surface of the metal substrate; in a first firing phase, exposing the conductor paste to a continuously increasing temperature to a firing temperature; in a second firing phase, exposing the conductor paste to about the firing temperature for a firing period; in a cooling phase, cooling down the conductor paste; and in a post-treatment phase, mechanically treating the at least a portion of the metal substrate.

In some embodiments, the conductor paste can include a metal power, an inorganic powder and organic binding and dissolving agents. The metal power can include copper. The inorganic powder can include a glass from the $PbO$—$B_2O_3$—$SiO_2$ system or a glass including $Bi_2O_3$. The method can include electrically connecting the electrical component to the at least a portion of the metal substrate such that the electrical component is electrically connected through the conductor paste.

In some embodiments, the pulsed laser treatment process exposes the at least a portion of a surface of the metal substrate to the plurality of laser pulses at a frequency in a range from about 100 kHz to about 300 kHz. A laser spot size associated with each of the plurality of laser pulses can be about 75 μm. An overlap parameter associated with the pulsed laser pretreatment process can be in the range of about −15% to about −100%. The plurality of laser pulses can include twenty laser pulses or greater, such as forty laser pulses or greater. The min/max surface roughness (e.g., peak to valley measurement) for the metal substrate is modified to be in the range of about 3 μm to about 200 μm. A mean laser power of the plurality of laser pulses can be in the range of about 50 W to about 200 W.

In some embodiments, creating a metallized interface includes implementing a wire bonding process or a ribbon bonding process on the at least a portion of the surface of the metal substrate. In some embodiments, creating a metallized interface includes bonding an electrical device to the metal substrate with a conductive adhesive glue.

In particular aspects of these example embodiments, the pulsed laser treatment process can expose the at least a portion of a surface of the metal substrate to the plurality of laser pulses at a frequency in a range from about 100 kHz to about 200 kHz. A laser spot size associated with each of the plurality of laser pulses can be about 75 μm. An overlap parameter associated with the pulsed laser pretreatment process can be in the range of about −30% to about +30%. The plurality of laser pulses can include 1 to 10 laser pulses. The min/max surface roughness (e.g., peak to valley measurement) for the metal substrate is modified to be in the range of about 3 μm to about 200 μm. A mean laser power of the plurality of laser pulses can be in the range of about 50 W to about 200 W.

In some embodiments, the laser system comprises a suction port operable to remove metal particles during the pulsed laser treatment process. The pulsed laser treatment process can be implemented in a chamber having a nitrogen process gas.

Another example embodiment of the present disclosure is directed to a method for processing a metal substrate. The metal substrate has aluminum or an aluminum alloy. The method includes performing a pulsed laser treatment process on at least a portion of the surface of the metal substrate, the laser treatment process exposing the at least a portion of the surface of the metal substrate to a plurality of laser pulses; and after performing the pulsed laser treatment process: applying a conductor paste using a screen-printing process to the at least a portion of the surface of the metal substrate; in a first firing phase, exposing the conductor paste to a continuously increasing firing temperature to a maximum firing temperature; and in a second firing phase, exposing the conductor paste to about the maximum firing temperature for a firing period.

Another example embodiment of the present disclosure is directed to a method for processing a metal substrate. The metal substrate has aluminum or an aluminum alloy. The method includes performing a pulsed laser treatment process on at least a portion of the surface of the metal substrate, the laser treatment process exposing the at least a portion of the surface of the metal substrate to a plurality of laser pulses; and after performing the pulsed laser treatment process, implementing a wire bonding process or a ribbon bonding process on the at least a portion of the surface of the metal substrate.

Another example embodiment of the present disclosure is directed to a method for processing a metal substrate. The metal substrate has aluminum or an aluminum alloy. The method includes performing a pulsed laser treatment process on at least a portion of the surface of the metal substrate, the laser treatment process exposing the at least a portion of the surface of the metal substrate to a plurality of laser pulses; and after performing the pulsed laser treatment process, bonding an electrical device to the metal substrate with a conductive adhesive glue.

As used herein, the use of the term "about" in conjunction with a numerical value refers to within 20% of the stated numerical value.

FIG. 1 depicts an example laser pretreatment system 100 for pretreating a metal substrate (e.g., a metal substrate having aluminum and/or an aluminum alloy). The laser pretreatment system 100 includes a support 115 operable to support or hold a metal substrate 102 during laser pretreatment. The support 115 can be any device or structure capable of mechanically holding the metal substrate 102 in the path of a laser beam. For instance, the support 115 can be a table, gripper, robotic arm, air cushion, shelf, or other structure that is operable to mechanically hold a metal substrate 102 in the path of a laser beam.

The laser pretreatment system 100 includes a laser source 110 operable to emit a laser beam 114. In some embodiments, the laser source 110 can include and/or emit a laser beam onto one or more optics 112 to emit the laser beam towards the metal substrate 102. The optics 112 can include, for instance, one or more lenses, mirrors, beam splitters, collimators, etc. In some embodiments, the laser source 110 can emit a plurality of laser pulses. The laser pulses can have a duration of, for instance, about 5 ns to about 500 ns. The laser source 110 can be configured to generate laser intensities of, for instance, about 2.5 MW/cm$^2$ or greater, such as about 4.5 MW/cm$^2$ or greater, such as about 5 MW/cm$^2$ or greater.

The laser source 110 can be coupled to a controller 120 that can be used to control various operational parameters of the laser source 110, optics 114, and/or laser beam 114. For example, the controller 120 can control the laser beam intensity (power), pulse duration, pulse frequency, laser spot size (size of laser incident on the metal substrate), number of laser pulses, etc.

In some embodiments, the controller 110 can control translational movement of the laser source 110 in the x, y, and z directions to implement a desired laser treatment regime on the metal substrate 102. The controller 110 can control optics 112 (e.g., mirror position) to direct the laser beam 114 to different parts of the metal substrate 102. In some embodiments, the controller 110 can control support 115 to move the metal substrate 102 relative to the laser beam 114.

The controller 110 can control laser source 110, optics 112, and/or support 115 to provide a desired overlap parameter for the laser treatment process. An overlap parameter refers to the amount of overlap (scaled by spot diameter) of adjacent laser spots on the surface. For instance, a 0% overlap parameter means that the circles of two neighboring laser spots are touching. A positive value (e.g., +10%) means that the circles of two neighboring laser spots overlap. A negative value (e.g., −10%) means that the circles of two neighboring laser spots are separated.

Figure 2:
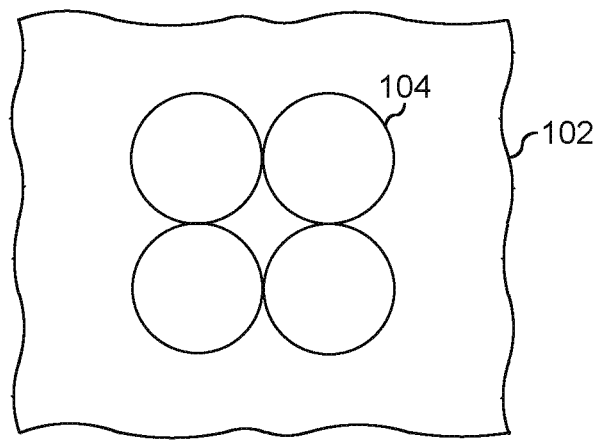
FIGS. 2, 3, and 4 depict example overlap parameters for a laser treatment process according to example embodiments of the present disclosure.

For instance, FIG. 2 depicts laser spots 104 or a metal substrate 102. The perimeter edges of the laser spots 104 are touching. There is no overlap between the laser spots 104. Moreover, the laser spots 104 are not separated by a distance. In this regard, the laser spots 104 in FIG. 2 have a 0% overlap parameter.

Figure 3:
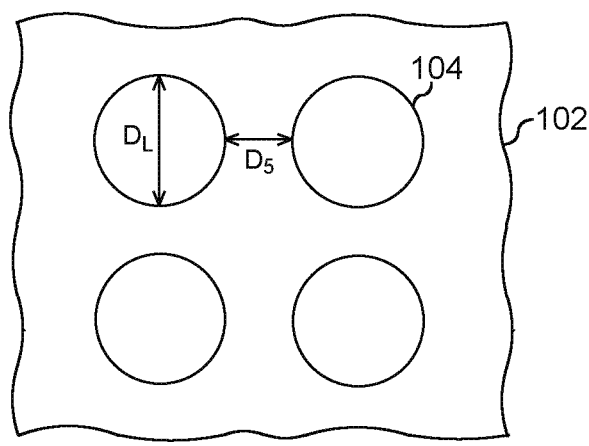

FIG. 3 depicts laser spots 104 on a metal substrate 102 having a diameter $D_L$. The laser spots 104 are separated by a distance $D_S$. The overlap parameter is negative because the laser spots 104 do not overlap and are separated by a distance. The overlap parameter can be expressed as a percentage calculated as $-D_S/D_L*100$.

Figure 4:
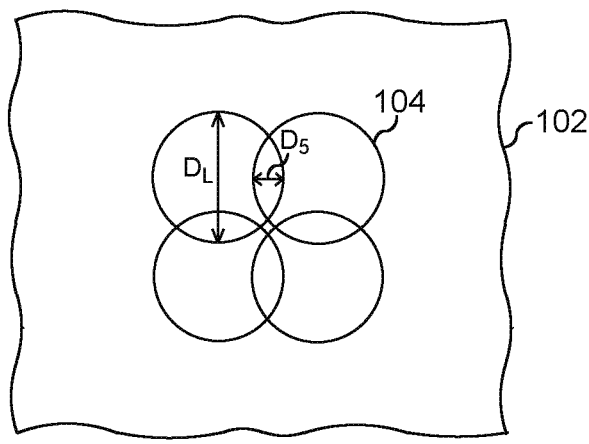

FIG. 4 depicts laser spots 104 on a metal substrate 102 having a diameter $D_L$. The laser spots 104 overlap by a distance $D_S$. The overlap parameter is positive because the laser spots 104 overlap one another. The overlap parameter can be expressed as a percentage calculated as $D_S/D_L*100$.

Referring back to FIG. 1, the controller 120 can be any suitable device capable of controlling operation of components of the laser treatment system 100. In some embodiments, the controller 120 can include one or more processors and one or more memory devices. The one or more processors can execute computer-readable instructions stored on the one or more memory devices to cause the processors to perform operations. The operations can include sending control signals (e.g., over a wired or wireless communication interface) to components of the laser treatment system 100 to control components of the laser treatment system 100. For instance, the computer-readable instructions can specify operation parameters for the laser treatment process of a metal substrate according to example embodiments of the present disclosure. Example operational parameters are discussed in conjunction with example embodiments below.

The controller 120 can be in communication with an input device 125. The input device can be any device capable of receiving input from a user to input, control, configure, program, or otherwise interact with the controller 120. The input device 125 can include, for instance, a laptop, desktop, computing device, tablet, smartphone, mobile device, or other device capable of receiving an input from a user. In some applications, a user can interact with the controller 120 via input device 125 to specify operational parameters for a laser treatment process of a metal substrate.

As shown, the laser source 110 can be configured to treat the metal substrate 102 with a plurality of laser pulses in a chamber interior 118. In some embodiments, the chamber interior 118 can be provided with a suitable process gas to provide an appropriate atmosphere for laser treatment of the metal substrate. For example, the chamber interior 118 can be provided with a substantially nitrogen gas atmosphere.

FIG. 1 depicts one example laser treatment system 100 that can be used to implement a laser pretreatment process according to example embodiments of the present disclosure for purposes of illustration and discussion. Those of ordinary skill in the art, using the disclosures provided herein, will understand that other laser treatment systems can be used without deviating from the scope of the present disclosure. For instance, U.S. Pat. No. 8,497,448 and DE 19900910 A1 describes example laser treatment systems, which are incorporated herein by reference.

Figure 5:
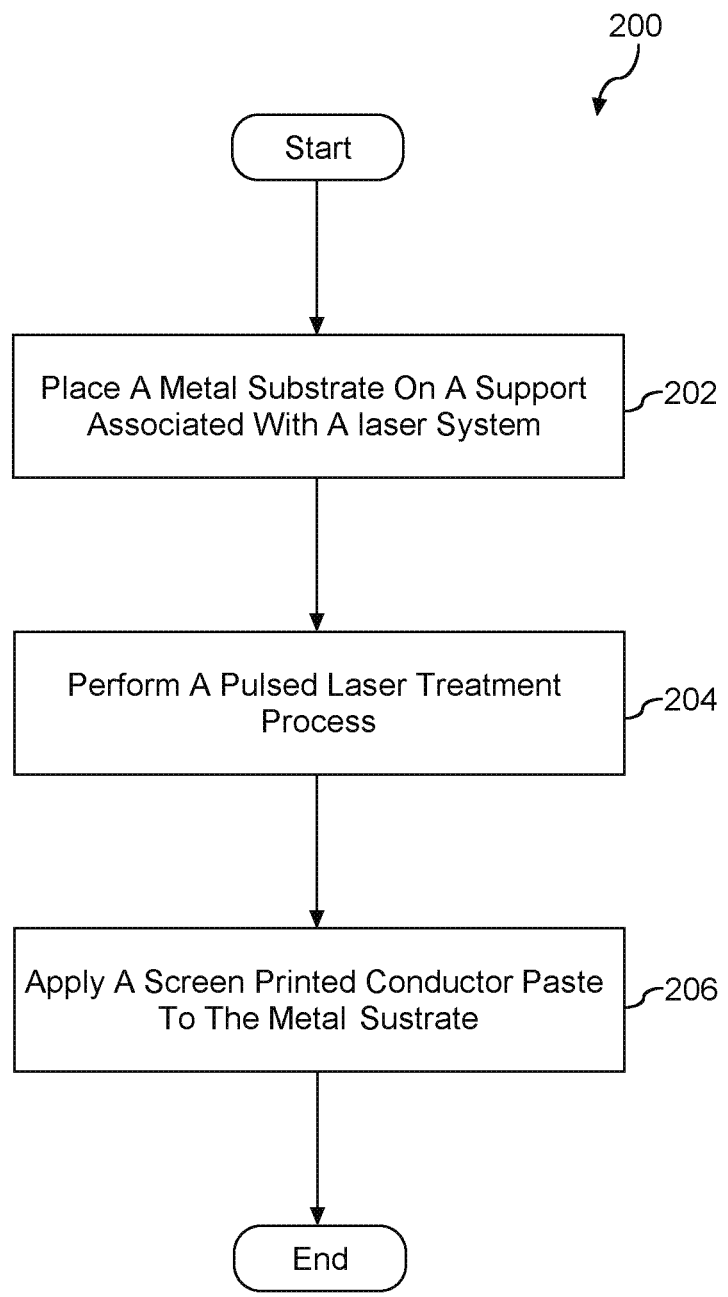
FIG. 5 depicts a flow diagram of an example method according to example embodiments of the present disclosure.

FIG. 5 depicts a flow diagram of an example method (200) for treating a metal substrate for use in a power electronics device (e.g., LED, IGBT, etc.). The power electronics device can be used, for instance, in the automotive field. The method (200) can be implemented at least in part, for instance, using the laser treatment system 100 of FIG. 1. FIG. 5 depicts steps performed in a particular order of purposes of illustration and discussion. Those of ordinary skill in the art, using the disclosures provided herein, will understand that various steps of any of the methods described herein can be omitted, expanded, performed simultaneously, performed in conjunction with steps not illustrated, rearranged, adapted and/or modified in various ways without deviating from the scope of the present disclosure.

At (202), the method can include placing a metal substrate on a support associated with a laser treatment system. For example, metal substrate 102 can be placed on support 115 of FIG. 1. The metal substrate can be aluminum and/or an aluminum alloy. For example, the aluminum material can be of the quality EN AW-1050A or EN AW-1060A in accordance with European Standard EN 573, which contains at least 99.5% by weight or 99.6% by weight of aluminum. As another example, the metal substrate can include an aluminum allow having manganese or magnesium. For instance, the metal substrate can include EN AW-3003 (AlMn1Cu), EN AW-5005 (AlMg1), EN AW-3103 (AlMn1), or EN AW-5754 (AlMg3). Those of ordinary skill in the art, using the disclosures provided herein, will understand that other suitable metal substrates can be used without deviating from the scope of the present disclosure.

At (204) of FIG. 2, the method can include performing a pulsed laser treatment process on the metal substrate. The pulsed laser treatment process can expose at least a portion of a surface of the metal substrate to a plurality of laser pulses to modify a surface of the substrate (e.g., surface roughness). For instance, the controller 120 of FIG. 1 can control components of the laser treatment system 100 to implement the pulsed laser treatment process according to various operations parameters (e.g., power, frequency, overlap parameters, etc.).

One set of example operational parameters are provided below:
- Laser Frequency: about 100-300 kHz
- Laser spot size (RMS): about 75 μm
- Lens/objective: about 254 mm
- Overlap parameter: about −15 to −100%
- Pulse number: about 20-40
- Mean laser power about 50-200 W, such as between about 100 and 200 W
- Resulting min/max surface roughness for aluminum surface: about 17 to 200 μm.

At (206), the method can include applying a screen printed conductor paste to the metal substrate. The screen-printed conductor paste can be processed to create a metallized interface for coupling an electrical device to the metal substrate.

Figure 6:
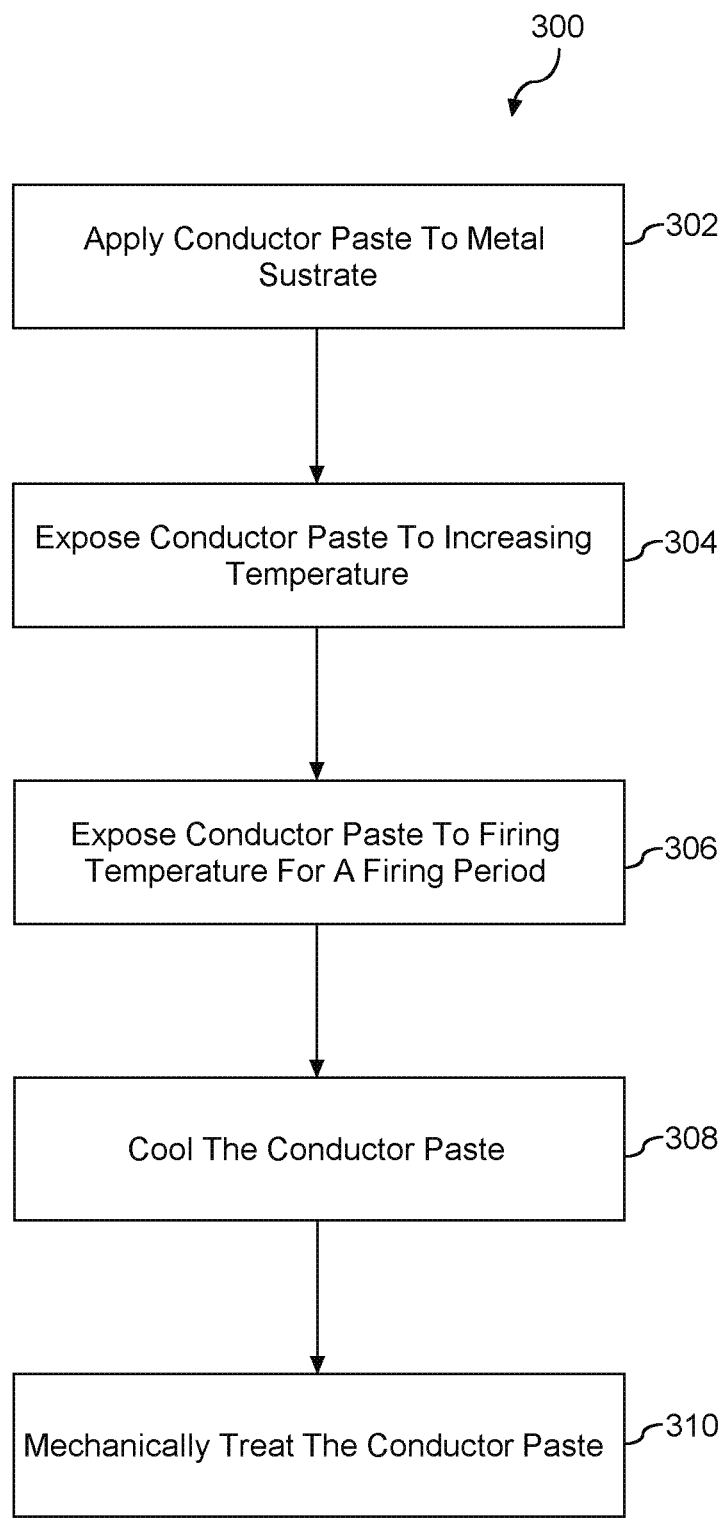
FIG. 6 depicts a flow diagram of an example process for creating a metallized interface using a conductor paste according to example embodiments of the present disclosure.

For instance, FIG. 6 depicts a flow diagram of an example process (300) for creating a metallized interface using a conductor paste according to example aspects of the present disclosure. FIG. 6 depicts steps performed in a particular order of purposes of illustration and discussion. Those of ordinary skill in the art, using the disclosures provided herein, will understand that various steps of any of the methods described herein can be omitted, expanded, performed simultaneously, performed in conjunction with steps not illustrated, rearranged, adapted and/or modified in various ways without deviating from the scope of the present disclosure.

At (302), the process can include applying a conductor paste to the metal substrate (e.g., using a screen-printing process). In some embodiments, the conductor paste can include, for instance, a metal powder, an inorganic power, and organic binding and dissolving agents. The metal power can include, for instance, copper or silver. The inorganic power can include, for instance, a glass from the PbO—$B_2O_3$—$SiO_2$ system or a glass including $Bi_2O_3$.

At (304), the process can include exposing the conductor paste to increasing temperature until it reaches a firing temperature. At (306), the process can include exposing the conductor paste to the firing temperature for a firing period. At (308), the process can include cooling the conductor paste. At (310), the process can include mechanically treating the conductor paste.

Details associated with screen printing a conductor paste to the metal substrate to create a metallized interface is disclosed in U.S. Patent Application Publication No. 2015/0044360. For example, a conductor paste can be applied to at least some sections of a surface of said substrate. In a first firing phase, the conductor paste is exposed to a substantially continuously increasing firing temperature which is increased to a pre-definable maximum firing temperature of less than approximately 660° C. In a second firing phase, the conductor paste is substantially exposed to the pre-definable maximum firing temperature for a pre-definable time period. In a cooling phase, the conductor paste is cooled down; and in a post-treatment phase, a surface of the conductor paste is mechanically post-treated, such as brushed.

The surface of a metal substrate, in particular an aluminum substrate, can be reliably metallized by the specified process steps. The regions at which the conductor paste is applied by the specified method and sintered in accordance with the process steps provide for electrical contacting of the substrate instead of the oxidized surface of the substrate, that prevails in that region. That electrically conductive layer which is achieved at least region-wise by the application and sintering of the conductor paste can consequently be used for example for soldering an electronic component thereto or also for soldering on a cooling body, wherein the cooling body itself can again comprise aluminum.

In that case the substrate can at least partially and/or comprise an aluminum material with as high a proportion of aluminum as possible. The aluminum material can be of the quality EN AW-1050A or EN AW-1060A in accordance with European Standard EN 573, which contains at least 99.5% by weight or 99.6% by weight of aluminum. In spite of somewhat lower liquidus temperatures and lower thermal conductivity in comparison with the above-mentioned substantially pure aluminum materials it is also possible to use aluminum alloys, for example aluminum alloys containing manganese or magnesium like for example EN AW-3003 (AlMn1Cu), EN AW-3103 (AlMn1), EN AW-5005 (AlMg1) or EN AW-5754 (AlMg3).

The process affords the possibility of selectively metalizing individual regions of the surface of an aluminum-based substrate, wherein the metallized regions are joined in the form of a sintered conductor paste to the substrate directly in bonding joining of the materials involved and wherein, in that way, it is possible to achieve high electrical conductivity and high thermal conductivity of conductor paste to substrate and vice-versa. The metallized regions additionally represent solderable regions, by which the substrate can be joined to further components in known fashion. Thus, for example individual electronic components can be soldered on to the metallized regions using conventional soldering agents like eutectic Sn—Pb—, Sn—Ag—Cu—or Sn—Au-solders.

For improved heat dissipation, potential-free connections of components like high-power LED modules or power electronic modules can also be soldered on to an aluminum substrate by the metallized regions without having to use an interposed insulating dielectric layer and without an expensive silver-based heat conductive paste, whereby overall a lower degree of thermal resistance can be achieved. Due to the reduced thermal resistance and the increased thermal conductivity the structural sizes of the components joined to the substrate can be reduced or they can be operated with higher power deliveries. Conventional soldering agents (see above) can be used for soldering the components to the metallized regions. It is thus possible to dispense with special aluminum soldering agents which often contain halogens.

A further area of use of the proposed method is the metallization of aluminum current bus bars for improving the reliability of the connections to current cables connected thereto. Metallization of the surface of an aluminum bus bar with a copper-based conductor paste makes it possible in particular to prevent intermetallic diffusion phenomena and electrochemical reactions with copper current cables connected thereto.

According to a particular embodiment, it can be provided that the conductor paste is applied to the surface of the substrate by a screen-printing process. The screen-printing technology is an established process for producing conductor tracks on substrates. In the field of power electronics a so-called "insulated metal substrate" (IMS) is frequently used as the substrate, which includes a core of aluminum and which is encased by an electrically insulating or dielectric layer. The core of aluminum is used in this case for improved thermal conduction. The conductor tracks themselves which are applied to the insulating layer for example by means of screen printing are in that case not electrically contacted with the core of aluminum.

An aim of the process however is to achieve direct electrical contacting of conductor tracks disposed on the substrate, with the substrate itself. That is made possible insofar as the conductor tracks or conductor surfaces can be arranged directly on the substrate by way of the proposed process without having to provide an insulating layer therebetween. A connection involving bonding joining of the materials involved is achieved between sintered conductor paste and substrate, by which the sintered conductor paste is electrically and thermally contacted directly with the substrate. In that respect conventional conductor pastes in the form of thick-layer pastes or sinter pastes can be used. Due to the porosity of thick-layer pastes it is possible to compensate for different degrees of thermal expansion of conductor paste and substrate whereby the reliability of the join between the conductor paste and the substrate can be increased, in particular in the case of major cyclic thermal stresses like for example in the automobile field.

A thick-layer conductor paste can include at least a metal powder as an electrically conductive agent, an inorganic powder (for example glass frits) as a bonding agent, and organic binding and dissolving agents. The organic binding and dissolving agents lead to a paste-like consistency enjoying given rheological properties which however are also influenced by the further constituents of the conductor paste.

In regard to the constituent of the electrically conductive metal powder it can be provided that a conductor paste including a copper powder is used. It will be appreciated however that it is also possible to use a conductor paste including a silver and/or gold powder.

In regard to the constituent of the inorganic powder it can be provided that a conductor paste is used, containing a glass from the $PbO$—$B_2O_3$—$SiO_2$ system and/or a glass including $Bi_2O_3$. In that way, during the sintering process in the process, in spite of the comparatively low firing temperatures prevailing in that situation, it is possible to achieve very good adhesion of the conductor paste to the substrate.

After a conductor paste is applied by printing, for example by a screen-printing process, the conductor paste remains substantially on the corresponding regions by virtue of its rheological properties, without flow to any extent worth mentioning. In order to prepare the conductor paste applied to the surface of the substrate in enhanced fashion for the firing or sintering operation, it can be provided that prior to the first firing phase the conductor paste is dried in a drying phase at a temperature of between about 80° C. and about 200° C., such as between 100° C. and 150° C., such as at a maximum 130° C., for a period of time of between about 5 min and about 20 min. Due to that drying phase the solvents present in the conductor phase are substantially completely dissipated. In that respect known drying methods like for example infrared or hot air drying are used. Due to the drying process and the linked dissipation of the solvents in the conductor paste the conductor paste experiences a certain shrinkage in volume. It is however already possible to counteract that beforehand by applying the conductor paste in a correspondingly thicker layer.

Firing or sintering of the conductor paste in the first and/or second firing phase of the proposed process can be implemented in a firing furnace, the firing temperature prevailing therein. It will be appreciated that the drying phase and/or the cooling phase can also be implemented in the firing furnace. In that case a firing furnace with a conveyor device can be used.

A suitable firing profile can be applied in dependence on the material combination used, of substrate and conductor paste. A particular variant provides that in the first firing phase the firing temperature is increased at least temporarily by between about 40° C./min and about 60° C./min. It can further be provided that in the first firing phase the firing temperature is increased to a maximum firing temperature of about 580° C. (e.g., a eutectic temperature), such as about 565° C., such as about 548° C. Heating the conductor paste over between about 400° C. and 450° C. has the result that all organic constituents therein like for example organic binding agents are substantially completely dissolved and the inorganic constituents (for example glass powder or glass frits) soften. In addition, the metal powder sintering process starts at those temperatures. The softened glass constituents of the conductor paste further result in good adhesion bonding of the conductor paste on the substrate.

The maximum firing temperature is basically limited by the melting temperature of aluminum, which is about 660° C. When using a silver-based conductor paste the maximum firing temperature is about 540° C. while when using a copper-based conductor paste the maximum firing temperature is about 580° C. Those temperatures derive from the melting temperatures of possible eutectic temperatures for aluminum-copper or aluminum-silver.

In regard to the respective maximum firing temperature suitable glass constituents are to be selected for a conductor paste, the corresponding glass transition temperature (TG) or melting temperature (Ts) of those constituents being adapted to that maximum firing temperature. The glass transition temperature or melting temperature of the glass constituent of the corresponding conductor paste should accordingly be suitably below the specified maximum firing temperatures to ensure optimum adhesion of the conductor paste to the substrate. In particular glasses from the $PbO$—$B_2O_3$—$SiO_2$ system or glasses including $Bi_2O_3$ are suitable.

It can be advantageous if firing of the conductor paste in the second firing phase is effected for between about 5 min and about 30 min. Basically, the longer the period of time in the second firing phase (at the maximum firing temperature), the correspondingly more densely is the conductor paste sintered and thus has better properties for further processing (for example soldering and welding). If excessively long periods of time are used in the second firing phase however the transit time in a typical firing furnace is correspondingly increased in length, which can have an adverse effect on the overall through-put.

In a further advantageous variant, it can be provided that the predeterminable maximum firing temperature is kept substantially constant (e.g., within 20%) in the second firing phase.

In addition, it can be provided that the conductor paste in the first firing phase and/or the second firing phase is exposed to a protective gas atmosphere including nitrogen. A protective gas atmosphere (for example nitrogen) is advantageous for burning in copper conductor track pastes in order to prevent oxidation of the conductor track material (depending on the firing phase there can be a residual oxygen content of some ppm). The organic binders of such a material or the conductor paste can in that case be so conceived that they can be reduced under a nitrogen atmosphere. In some embodiments, the gas atmosphere does not include any oxygen gas to reduce oxidation of aluminum.

In one implementation of the process, it can be provided that in the cooling phase the firing temperature is reduced at least temporarily by between about 20° C./min and about 40° C./min, such as by about 30° C./min. In that case cooling is implemented to ambient temperature. The slower the cooling operation, the correspondingly less are the mechanical effects on the connection between the conductor paste and the substrate by virtue of different coefficients of thermal expansion of the materials used.

Due to oxidation of the sintered conductor paste, which can occur during the firing or sintering process due to the high temperatures prevailing then, it is provided that the surface of the conductor paste is suitably mechanically post-treated after the cooling step in order to facilitate further processing, for example for subsequent soldering or welding processes.

In some embodiments, it can be provided that the conductor paste is applied in a thickness of between about 10 μm and about 100 μm to the surface of the substrate. It will be appreciated that it is also possible to apply conductor pastes in a thickness of less than 10 μm or conductor pastes in a thickness of more than 100 μm to the surface of the substrate. It can also be provided that the proposed method is applied a plurality of times in succession in order to increase the overall resulting conductor paste thickness.

Figure 7:
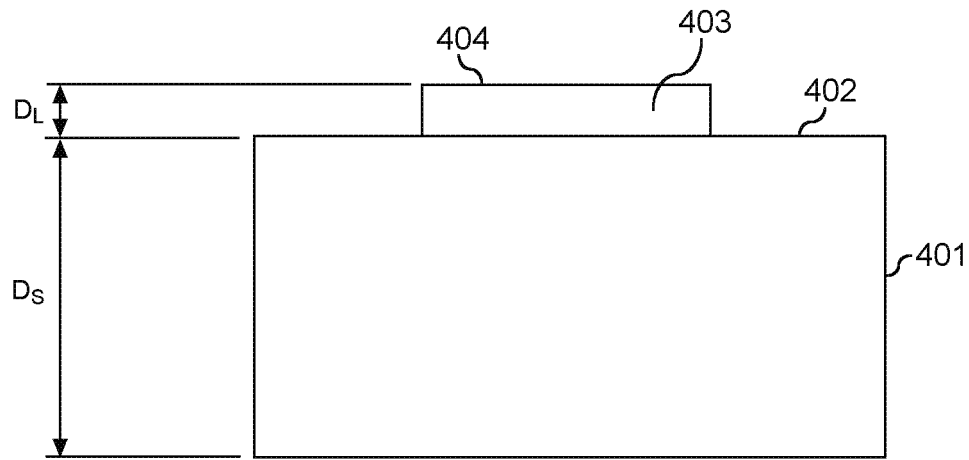
FIG. 7 depicts an example metal substrate with a conductor paste according to example embodiments of the present disclosure.

FIG. 7 shows a cross-section (not to scale) through a substrate 4011 of substantially pure aluminum or a high-purity aluminum alloy after carrying out a proposed method. In this case the substrate 401 comprises for example an aluminum material of the quality EN AW-1050A in accordance with European Standard EN 573, which contains at least 99.5% by weight of aluminum. The substrate 4011 is of a thickness DS of about 2 mm and has a substantially flat surface 402. In general, the substrate 401 can be of a thickness DS of at least 1 mm After a laser treatment process, a copper-based conductor paste 403 was applied to the surface 402 of the substrate 401 by means of a screen printing process, that is to say the conductor paste 403 used contains a copper powder as the electrically conductive constituent. The substrate 401 together with the conductor paste 403 was treated in accordance with a process using the firing profile of FIG. 8 to obtain a solderable aluminum substrate 401. The thickness DL of the fired or sintered conductor paste 403 after using the proposed method is about 35 μm in this example. The thickness DL of the fired or sintered conductor paste can be for example between about 20 μm and about 40 μm for copper conductor track pastes and between about 10 μm and about 20 μm for silver conductor track pastes. To improve the soldering properties of the conductor paste 403 which was fired or sintered in the proposed method the surface 404 of the sintered conductor paste 403 was mechanically post-treated, for example brushed.

Figure 8:
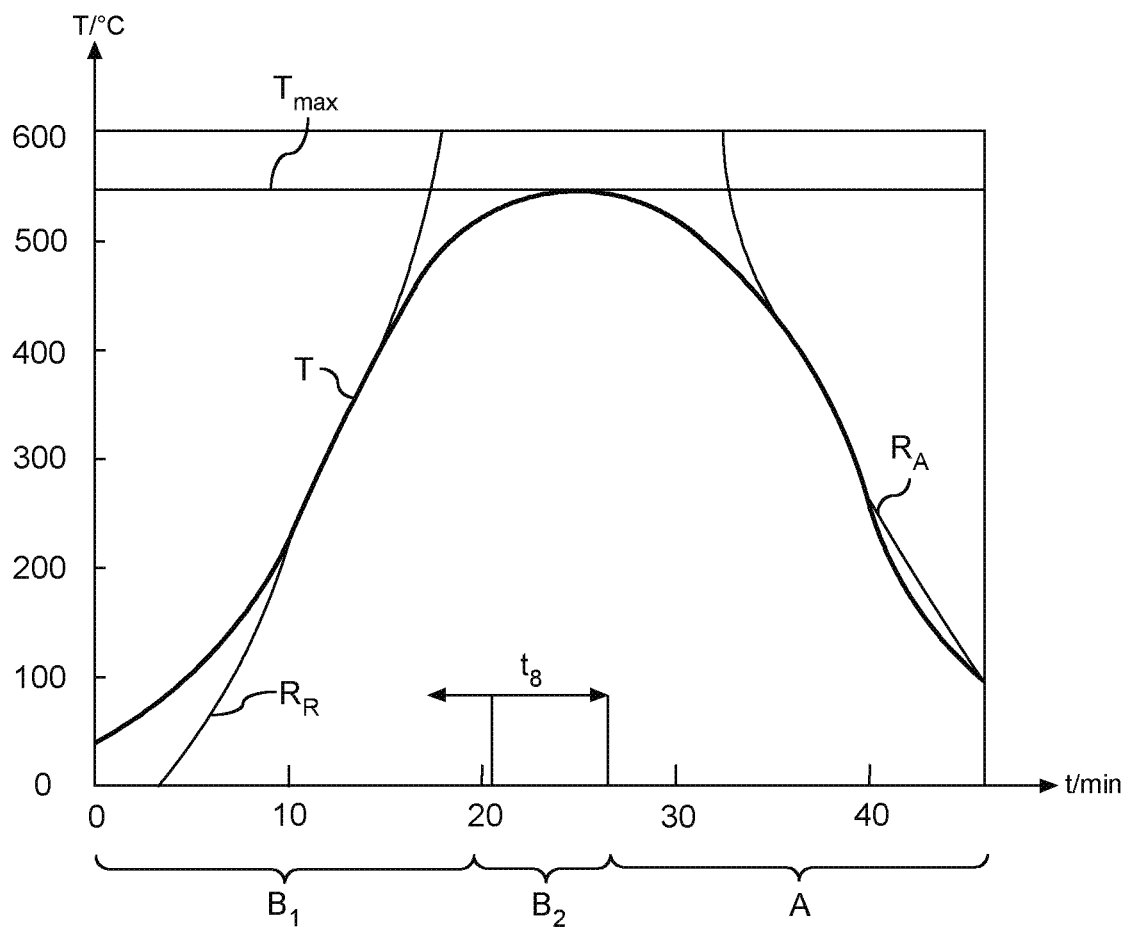
FIG. 8 depicts an example firing temperature profile for creating a metallized interface according to example embodiments of the present disclosure.

FIG. 8 shows a possible firing profile for the process. In this respect the illustrated diagram represents the variation in respect of time of the firing temperature T in a firing furnace, in which the first firing phase B1, the second firing phase B2 and the cooling phase A were carried out. In the first firing phase B1, starting from an ambient temperature of about 22° C., the firing temperature T was continuously increased to a predeterminable maximum firing temperature Tmax of about 542° C. The variation in respect of time of the firing temperature T in the first firing phase B1 is in this case substantially S-shaped with a substantially linear portion in which the firing temperature T was increased at a rate RB of about 46° C./min.

After reaching the predeterminable maximum firing temperature Tmax the conductor paste 3 and the substrate 1 were exposed in the second firing phase B2 to the predeterminable maximum firing temperature Tmax of about 542° C. for a predeterminable period tB of about 9 min, and thus the conductor paste 3 was fired or sintered.

In the following cooling phase A the firing temperature T was continuously reduced, wherein the firing temperature T decreases in relation to time t in a substantially S-shaped configuration. The reduction rate RA of the firing temperature T in the cooling phase A was approximately on average about 33° C./min.

Figure 9:
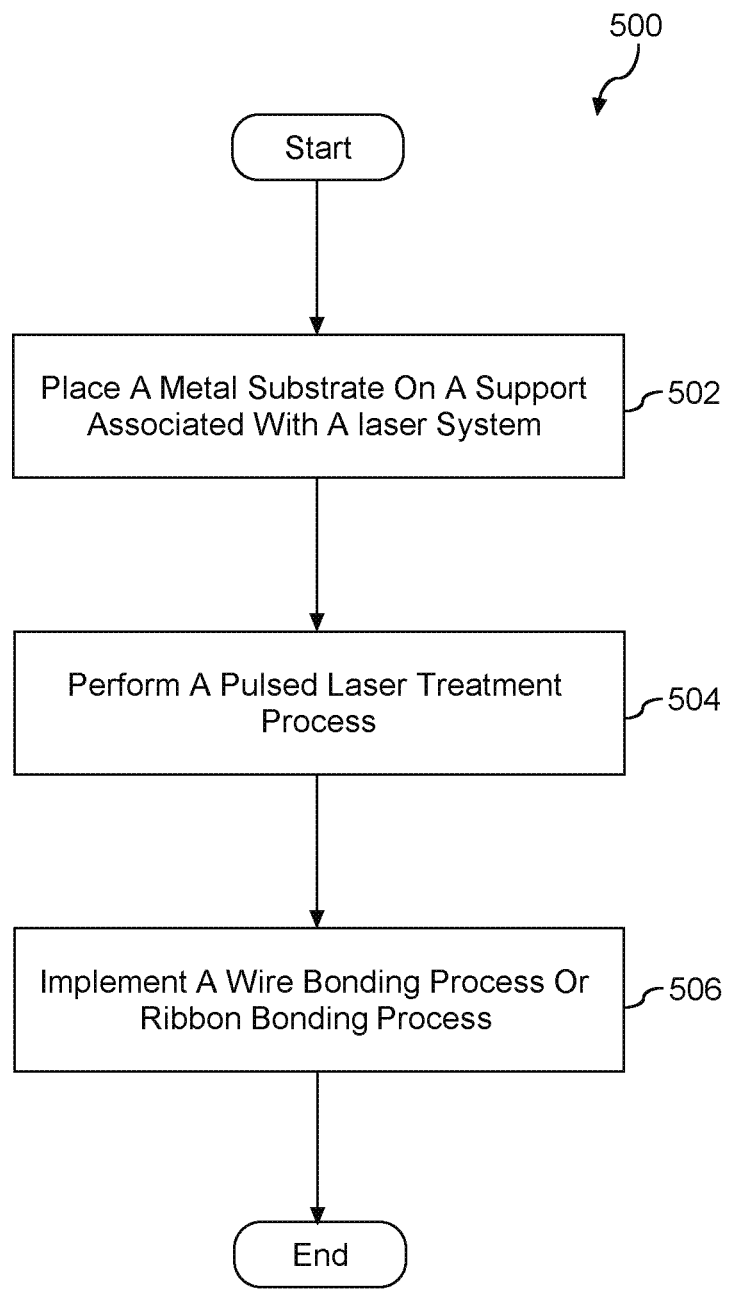
FIG. 9 depicts a flow diagram of an example method according to example embodiments of the present disclosure.

FIG. 9 depicts a flow diagram of an example method (500) for treating a metal substrate for use in a power electronics device (e.g., LED, IGBT, etc.). The power electronics device can be used, for instance, in the automotive field. The method (500) can be implemented at least in part, for instance, using the laser treatment system 100 of FIG. 1. FIG. 5 depicts steps performed in a particular order of purposes of illustration and discussion. Those of ordinary skill in the art, using the disclosures provided herein, will understand that various steps of any of the methods described herein can be omitted, expanded, performed simultaneously, performed in conjunction with steps not illustrated, rearranged, adapted and/or modified in various ways without deviating from the scope of the present disclosure.

At (502), the method can include placing a metal substrate on a support associated with a laser treatment system. For example, metal substrate 102 can be placed on support 115 of FIG. 1. The metal substrate can be aluminum and/or an aluminum alloy. For example, the aluminum material can be of the quality EN AW-1050A or EN AW-1060A in accordance with European Standard EN 573, which contains at least 99.5% by weight or 99.6% by weight of aluminum. As another example, the metal substrate can include an aluminum allow having manganese or magnesium. For instance, the metal substrate can include EN AW-3003 (AlMn1Cu), EN AW-5005 (AlMg1), EN AW-3103 (AlMn1), or EN AW-5754 (AlMg3). Those of ordinary skill in the art, using the disclosures provided herein, will understand that other suitable metal substrates can be used without deviating from the scope of the present disclosure.

At (504) of FIG. 9, the method can include performing a pulsed laser treatment process on the metal substrate. The pulsed laser treatment process can expose at least a portion of a surface of the metal substrate to a plurality of laser pulses to modify a surface of the substrate (e.g., surface roughness). For instance, the controller 120 of FIG. 1 can control components of the laser treatment system 100 to implement the pulsed laser treatment process according to various operations parameters (e.g., power, frequency, overlap parameters, etc.).

One set of example operational parameters are provided below:

Laser Frequency: about 100-200 kHz
Laser spot size (RMS): about 75 μm
Lens/objective: about 254 mm
Overlap parameter: about −30 to 30%
Pulse number: about 1-10
Mean laser power about 50-200 W, such as between about 100 and 200 W
Resulting min/max surface roughness for aluminum surface: about 4 to 90 μm.

At (506), the method can include implementing a wire bonding process or a ribbon bonding process. The wire bonding process or the ribbon bonding process can create a metallized interface between the aluminum substrate and an electrical device (e.g., through a wire bond or ribbon bond).

Figure 10:
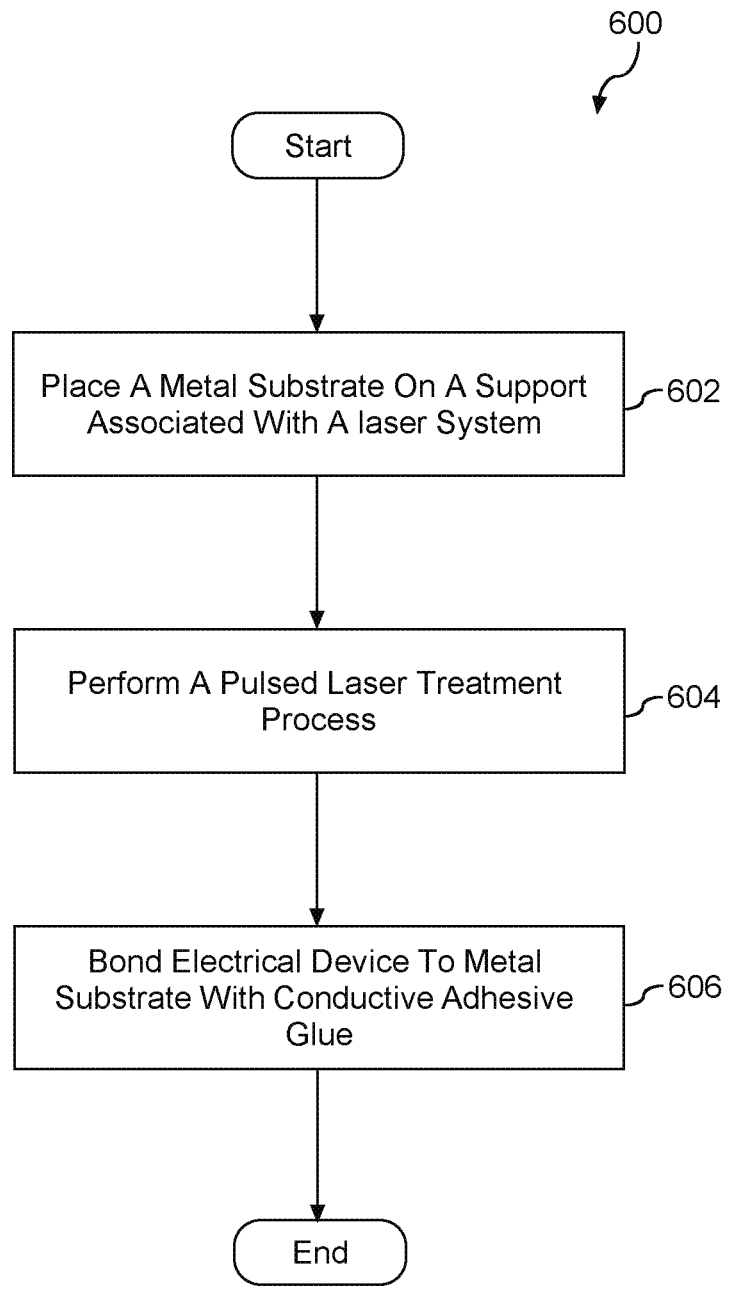
FIG. 10 depicts a flow diagram of an example method according to example embodiments of the present disclosure.

FIG. 10 depicts a flow diagram of an example method (600) for treating a metal substrate for use in a power electronics device (e.g., LED, IGBT, etc.). The power electronics device can be used, for instance, in the automotive field. The method (600) can be implemented at least in part, for instance, using the laser treatment system 100 of FIG. 1. FIG. 5 depicts steps performed in a particular order of purposes of illustration and discussion. Those of ordinary skill in the art, using the disclosures provided herein, will understand that various steps of any of the methods described herein can be omitted, expanded, performed simultaneously, performed in conjunction with steps not illustrated, rearranged, adapted and/or modified in various ways without deviating from the scope of the present disclosure.

At (602), the method can include placing a metal substrate on a support associated with a laser treatment system. For example, metal substrate 102 can be placed on support 115 of FIG. 1. The metal substrate can be aluminum and/or an aluminum alloy. For example, the aluminum material can be of the quality EN AW-1050A or EN AW-1060A in accordance with European Standard EN 573, which contains at least 99.5% by weight or 99.6% by weight of aluminum. As another example, the metal substrate can include an aluminum allow having manganese or magnesium. For instance, the metal substrate can include EN AW-3003 (AlMn1Cu), EN AW-5005 (AlMg1), EN AW-3103 (AlMn1), or EN AW-5754 (AlMg3). Those of ordinary skill in the art, using the disclosures provided herein, will understand that other suitable metal substrates can be used without deviating from the scope of the present disclosure.

At (604) of FIG. 10, the method can include performing a pulsed laser treatment process on the metal substrate. The pulsed laser treatment process can expose at least a portion of a surface of the metal substrate to a plurality of laser pulses to modify a surface of the substrate (e.g., surface roughness). For instance, the controller 120 of FIG. 1 can control components of the laser treatment system 100 to implement the pulsed laser treatment process according to various operations parameters (e.g., power, frequency, overlap parameters, etc.).

One set of example operational parameters are provided below:
Laser Frequency: about 100-200 kHz
Laser spot size (RMS): about 75 μm
Lens/objective: about 254 mm
Overlap parameter: about −30 to 30%
Pulse number: about 1-10
Mean laser power about 50-200 W, such as between about 100 and 200 W
Resulting min/max surface roughness for aluminum surface: about 4 to 90 μm.

At (606), the method can include bonding an electrical device to the metal substrate (e.g., die attach) using, for instance, a conductive adhesive glue to create a metallized interface. In some embodiments, the conductive adhesive glue can be a silver adhesive glue.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method of treating a metal substrate for use in a power electronics device, the method comprising:
   placing a metal substrate on a support associated with a laser system;
   performing a pulsed laser treatment process on at least a portion of the surface of the metal substrate, the laser treatment process exposing the at least a portion of the surface of the metal substrate to a plurality of laser pulses to modify a surface roughness of the at least a portion of the surface of the metal substrate; and
   after performing the pulsed laser treatment process, creating a metallized interface for coupling an electrical component to the metal substrate at the at least a portion of the surface of the metal substrate.

2. The method of claim 1, wherein the plurality of laser pulses removes at least a portion of an oxide layer on the metal substrate to prepare the metal substrate for coupling an electrical component to the metal substrate.

3. The method of claim 1, wherein the metal substrate comprises aluminum or aluminum alloy.

4. The method of claim 1, wherein creating a metallized interface comprises applying a screen-printed conductor paste to the at least a portion of the metal substrate.

5. The method of claim 4, wherein applying a screen-printed conductor paste to the at least a portion of the metal substrate, comprises:
   applying a conductor paste using a screen-printing process to the at least a portion of the surface of the metal substrate;
   in a first firing phase, exposing the conductor paste to a continuously increasing temperature to a firing temperature;
   in a second firing phase, exposing the conductor paste to about the firing temperature for a firing period;
   in a cooling phase, cooling down the conductor paste;
   in a post-treatment phase, mechanically treating the at least a portion of the metal substrate.

6. The method of claim 4, wherein the conductor paste comprises a metal power, an inorganic powder and organic binding and dissolving agents.

7. The method of claim 6, wherein the metal power comprises copper and wherein the inorganic powder comprises a glass from a $PbO$—$B_2O_3$—$SiO_2$ system or a glass including $Bi_2O_3$.

8. The method of claim 4, further comprising electrically connecting the electrical component to the at least a portion of the metal substrate such that the electrical component is electrically connected through the conductor paste.

9. The method of claim 1, wherein the pulsed laser treatment process exposes the at least a portion of a surface of the metal substrate to the plurality of laser pulses at a frequency in a range from about 100 kHz to about 3 kHz.

10. The method of claim 1, wherein a laser spot size associated with each of the plurality of laser pulses is about 75 μm.

11. The method of claim 1, wherein an overlap parameter associated with the pulsed laser treatment process is in a range of about −15% to about −100%.

12. The method of claim 1, wherein a min/max surface roughness for the metal substrate is modified to be in a range of about 3 μm to about 200 μm.

13. The method of claim 1, wherein a mean laser power of the plurality of laser pulses is in a range of about 50 W to about 200 W.

14. The method of claim 1, wherein creating a metallized interface comprises implementing a wire bonding process or a ribbon bonding process on the at least a portion of the surface of the metal substrate.

15. The method of claim 1, wherein creating a metallized interface comprises bonding an electrical device to the metal substrate with a conductive adhesive glue.

16. The method of claim 1, wherein the metallized interface has a resistance of less than about 0.1 mOhms.

17. A method for processing a metal substrate, the metal substrate comprising aluminum or an aluminum alloy, the method comprising:
performing a pulsed laser treatment process on at least a portion of the surface of the metal substrate, the laser treatment process exposing the at least a portion of the surface of the metal substrate to a plurality of laser pulses; and
after performing the pulsed laser treatment process, implementing a wire bonding process or a ribbon bonding process on the at least a portion of the surface of the metal substrate.

18. The method of claim 17, wherein the pulsed laser treatment process exposes the at least a portion of a surface of the metal substrate to the plurality of laser pulses at a frequency in a range from about 100 kHz to about 200 kHz; wherein a laser spot size associated with each of the plurality of laser pulses is about 75 μm; wherein an overlap parameter associated with the pulsed laser treatment process is in a range of about −30% to about +30%; wherein a min/max surface roughness for the metal substrate is modified to be in a range of about 3 μm to about 200 μm; wherein a mean laser power of the plurality of laser pulses is in a range of about 50 W to about 200 W.

19. A method for processing a metal substrate, the metal substrate comprising aluminum or an aluminum alloy, the method comprising:
performing a pulsed laser treatment process on at least a portion of the surface of the metal substrate, the laser treatment process exposing the at least a portion of the surface of the metal substrate to a plurality of laser pulses; and
after performing the pulsed laser treatment process, bonding an electrical device to the metal substrate with a conductive adhesive glue.

20. The method of claim 19, wherein the pulsed laser treatment process exposes the at least a portion of a surface of the metal substrate to the plurality of laser pulses at a frequency in a range from about 100 kHz to about 200 kHz; wherein a laser spot size associated with each of the plurality of laser pulses is about 75 μm; wherein an overlap parameter associated with the pulsed laser treatment process is in a range of about −30% to about +30%; wherein a min/max surface roughness for the metal substrate is modified to be in a range of about 3 m to about 200 μm; wherein a mean laser power of the plurality of laser pulses is in a range of about 50 W to about 200 W.

* * * * *